(12) United States Patent
Hung et al.

(10) Patent No.: US 7,330,082 B2
(45) Date of Patent: Feb. 12, 2008

(54) OSCILLATOR SYSTEM, METHOD OF PROVIDING A RESONATING SIGNAL AND A COMMUNICATIONS SYSTEM EMPLOYING THE SAME

(75) Inventors: Chih-Ming Hung, McKinney, TX (US); Robert B. Staszewski, Garland, TX (US); Dirk Leipol, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 10/924,220

(22) Filed: Aug. 23, 2004

(65) Prior Publication Data

US 2006/0038624 A1 Feb. 23, 2006

(51) Int. Cl.
*H03B 5/18* (2006.01)

(52) U.S. Cl. .................... 331/117 R; 331/167

(58) Field of Classification Search ............ 331/117 R, 331/167
See application file for complete search history.

(56) References Cited

U.S. PATENT DOCUMENTS

| | | | | |
|---|---|---|---|---|
| 6,091,309 A | * | 7/2000 | Burke et al. | ............. 331/117 R |
| 6,514,839 B1 | * | 2/2003 | Ker et al. | .................... 438/514 |
| 2002/0079979 A1 | * | 6/2002 | Richardson | ............. 311/117 R |

OTHER PUBLICATIONS

Leeson; "A Simple Model of Feedback Oscillator Noise Spectrum"; Proceedings of the IEEE; vol. 54, No. 2; Feb. 1966; pp. 329-330.
Elsayed et al.; "Low-Phase-Noise LC Quadrature VCO Using Coupled Tank Resonators in a Ring Structure"; IEEE Journal of Solid-State Circuits, vol. 36, No. 4, Apr. 2001; pp. 701-705.
Hegazi et al.; "A Filtering Technique to Lower LC Oscillator Phase Noise"; IEEE Journal of Solid-State Circuits, vol. 36, No. 12, Dec. 2001; pp. 1921-1930.
Straayer et al.; "A Low-Noise Transformer-Based 1.7GHz CMOS VCO"; ISSCC 2002, Session 17, Advanced RF Techniques, 17.1; Feb. 6, 2002.
Baek et al.; "Analysis on Resonator Coupling and its Application to CMOS Quadrature VCO at 8 GHz"; 2003 IEEE Radio Frequency Integrated Circuits Symposium; pp. 85-88.
Nallatamby et al.; "Extension of the Leeson Formula to Phase Noise Calculation in Transistor Oscillators with Complex Tanks"; IEEE Transactions on Microwave Theory and Technique, vol. 51, No. 3, Mar. 2003; pp. 690-696.

* cited by examiner

*Primary Examiner*—Joseph Chang
(74) *Attorney, Agent, or Firm*—Ronald O. Neerings; Wade James Brady, III; Frederick J. Telecky, Jr.

(57) ABSTRACT

An $n^{th}$-order oscillator system for providing a resonating signal, a method of generating a resonating signal and a communications system. In one embodiment, the $n^{th}$-order oscillator system, n being greater than two, includes (1) an amplifier configured to provide an intermediate signal and (2) a feedback loop including an $n^{th}$-order complex LC tank and configured to generate the resonating signal by feeding back a complex-filtered form of the intermediate signal to the amplifier.

20 Claims, 6 Drawing Sheets

OSCILLATOR SYSTEM, METHOD OF PROVIDING A RESONATING SIGNAL AND A COMMUNICATIONS SYSTEM EMPLOYING THE SAME

TECHNICAL FIELD OF THE INVENTION

The present invention is directed, in general, to oscillator systems and, more specifically, to an oscillator system having complex filtering, a method of providing a resonating signal and a communications system employing the same.

BACKGROUND OF THE INVENTION

An oscillator is an electronic device that uses an amplifier with positive feedback to generate a signal. The output of the amplifier is fed back, in phase, to an input of the amplifier to regenerate and sustain the signal. Oscillators are employed in a wide array of devices, such as computers and wireless transceivers.

In a wireless transceiver, such as a Radio Frequency (RF) communications systems, one or more oscillators provide the signal to a transmitter for upconverting (modulating) to an RF signal and to a receiver for downconverting (demodulating) from an RF signal. Modulation accuracy of the transceiver is essential to minimize bit error rate (BER) during communications. This results in challenging noise requirements for the oscillator(s), including stringent specifications for close-in and far-out phase noise.

The majority of oscillators used in RF communications systems are implemented using a single inductor-capacitor (LC) resonant circuit ("tank") with a single negative-resistance stage. Both single-ended, differential and quadrature oscillators are designed based on this principle for which the single LC tank provides only a second-order filtering to the noise power injected into the oscillator. In these oscillators with low order filtering, a low quality factor (Q) of the LC tank results in large power consumption and poor phase noise performance. Thus, a high LC tank Q, available headroom of a power supply and current consumption are needed for an oscillator to satisfy existing RF communications standards.

As a whole, however, the wireless communications industry is moving in the opposite direction regarding component Q as newer complementary metal-oxide semiconductor (CMOS) process technologies (also called process nodes) create products having an inferior LC tank Q and power supply operating margin. In addition, competition in the industry demands wireless products with lower current consumption so that a mobile terminal can last longer with present battery technology.

Thus, present oscillators typically require a high-Q inductor and a high-Q capacitor to meet stringent phase noise requirements demanded by the industry and communications standards. Future CMOS process nodes, however, will continue to decrease the Q of the LC tank resulting in phase noise worsening. Accordingly, additional fabrication costs will be required to produce high-Q tanks. In addition, increased quality demands for wireless applications place even more stringent phase noise requirements on the industry.

Accordingly, what is needed in the art is an oscillator having a low phase noise that satisfies wireless communications standards. More specifically, what is needed is an oscillator that can be implemented using present and future CMOS process technology that satisfies low phase noise requirements for stringent RF communications standards.

SUMMARY OF THE INVENTION

To address the above-discussed deficiencies of the prior art, the present invention provides an $n^{th}$-order oscillator system for providing a resonating signal, a method of generating a resonating signal and a communications system. In one embodiment, the $n^{th}$-order oscillator system, n being greater than two, includes (1) an amplifier configured to provide an intermediate signal and (2) a feedback loop including an $n^{th}$-order complex LC tank and configured to generate the resonating signal by feeding back a complex-filtered form of the intermediate signal to the amplifier. An $n^{th}$-order oscillator system has an associated LC tank of an $n^{th}$-order impedance that provides $n^{th}$-order filtering of the resonating signal.

The present invention provides an improved LC-tank-based oscillator system employing complex filtering that satisfies stringent phase noise requirements. The novel oscillator system obtains an improved oscillator phase noise performance even when implemented in a process with a limited Q-factor of an inductor and/or a capacitor while requiring limited or no analog extensions. Thus, the disclosed oscillator system can be embodied in a deep submicron CMOS process node and still satisfy phase noise requirements of present and future applications.

The present invention advantageously recognizes a cooperative arrangement of two LC tanks provides superior complex filtering of noise power associated with an oscillator compared to only the second-order filtering provided by the single LC tanks of conventional oscillators. Thus, the complex filtering of the present invention provided by the complex LC tank results in a reduction of phase noise compared to existing single LC tank oscillators.

Advantageously, the present invention discloses a novel oscillator system that can have lower LC tank Q compared to conventional oscillators and still satisfy stringent communication standards. In an embodiment to be discussed, the LC tank oscillator system includes two LC tanks that are actively coupled to form a complex LC tank that provides $4^{th}$-order complex filtering and relaxes LC tank Q requirement. Complex filtering is defined for the purposes of this invention as a filtering circuit having complex numbers in the denominator.

In another aspect, the present invention discloses a method of providing a resonating signal including (1) providing an intermediate signal employing an amplifier and (2) generating said resonating signal by feeding back a complex-filtered form of the intermediate signal to the amplifier through a loop that includes an $n^{th}$-order complex LC tank.

In yet another aspect, the present invention provides a communications system including (1) a transmitter, (2) a receiver and (3) an $n^{th}$-order oscillator subsystem for providing a resonating signal to the transmitter and the receiver, n being greater than two. The $n^{th}$-order oscillator subsystem includes (3A) an amplifier configured to provide an intermediate signal and (3B) a feedback loop including an $n^{th}$-order complex LC tank and configured to generate the resonating signal by feeding back a complex-filtered form of the intermediate signal to the amplifier.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
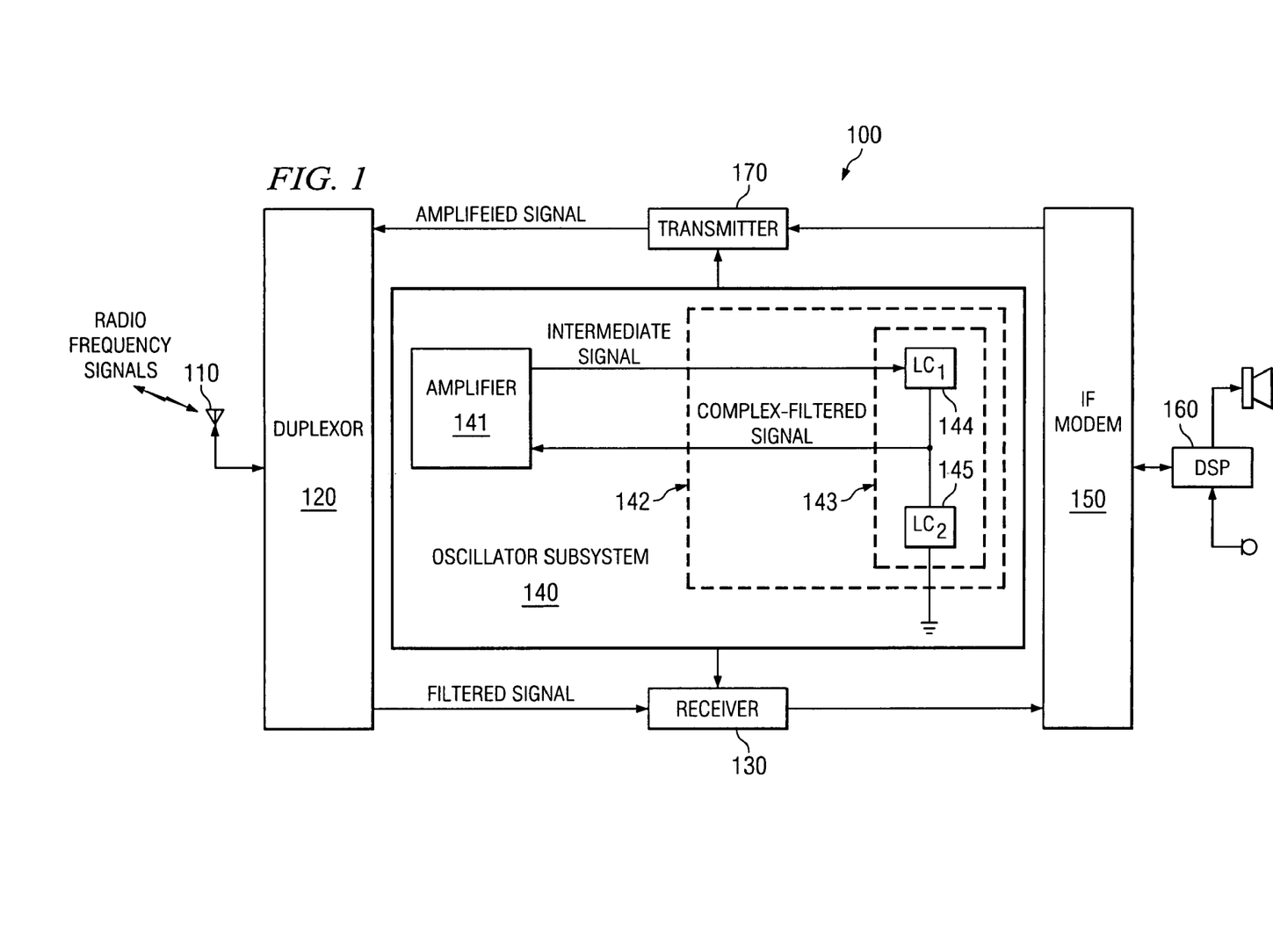
FIG. 1 illustrates a block diagram of an embodiment of a communications system constructed according to the principles of the present invention.

Referring initially to FIG. 1, illustrated is a block diagram of an embodiment of a communications system, generally designated 100, constructed according to the principles of the present invention. The communications system 100 includes an antenna 110, a duplexer 120, a receiver 130, an oscillator subsystem 140, an intermediate frequency (IF) modem 150, a digital signal processor (DSP) 160 and a transmitter 170. In addition to the illustrated components, one skilled in the art will understand that the communications system 100 may also include other components that are typically employed in conventional wireless communications systems, such as, a power amplifier, a power manager and an application processor. Additionally, the present invention applies to communications systems that may not include each component that is illustrated. For example, a communications system may be a downlink system that does not include a transmitter, such as, in a Global Positioning System (GPS) receiver.

The communications system 100 is a wireless communications system that can be embodied as an RF transceiver. The antenna 110, duplexer 120, IF modem 150 and the DSP 160 may be conventional components typically employed in a conventional wireless communications system. The receiver 130 and the transmitter 170 may also be a conventional receiver and transmitter. The receiver 130 includes a low noise amplifier (LNA), an RF filter, an RF mixer, an IF filter and an IF amplifier. The transmitter 170 includes an IF filter, an RF mixer, an RF filter and a preamplifier.

In a receive mode, the antenna 110 receives an RF signal that is filtered by the duplexer 120 to attenuate transmit band signals. The receiver 130 amplifies the filtered signal employing the LNA and the RF filter. The RF mixer down-converts the RF signal to an IF using a resonating signal generated by the oscillator subsystem 140. The IF modem 150 then demodulates the IF signal and outputs in-phase and quadrature-phase data for the DSP 160. The DSP 160 reconstructs the original message that was transmitted from the in-phase and quadrature-phase data. The reconstructed original message is then sent to a speaker or, for example, a digital media such as an MP3 player.

When the communications system 100 is in a transmit mode, an input voice message from a microphone is received and processed by the DSP 160 to generate in-phase and quadrature-phase data streams. The IF modem 150 then modulates the data streams with in-phase and quadrature phase signals to produce an IF signal. The transmitter 170 filters the IF signal and mixes the IF signal with a resonating signal from the oscillator subsystem 140 to generate an RF signal. The RF signal is then filtered, amplified by the power amplifier and fed to the antenna 110 through the duplexer 120 that attenuates the spurious signal level.

Figure 2:
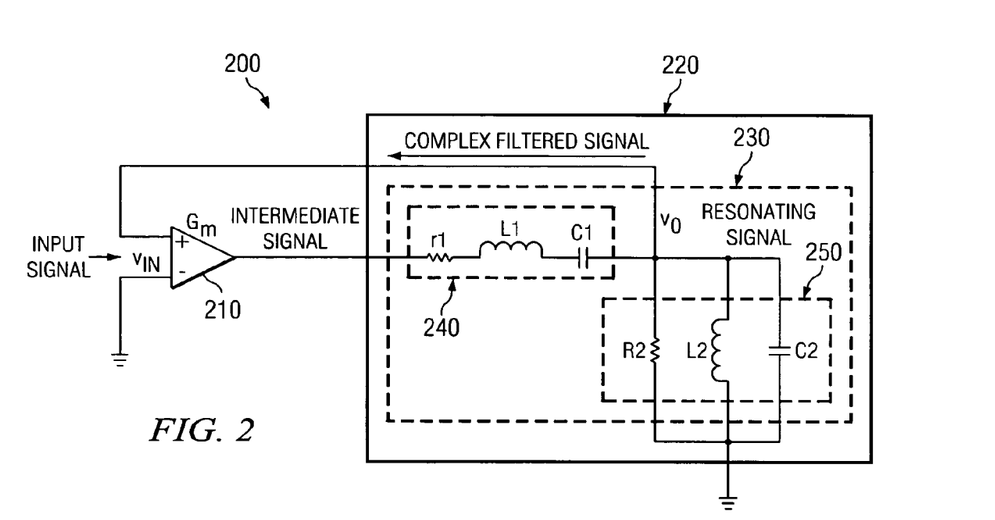
FIG. 2 illustrates a block diagram of an embodiment of an oscillator system constructed according to the principles of the present invention.

The oscillator subsystem 140 is an $n^{th}$-order oscillator with n being greater than two. The oscillator subsystem 140 is embodied using CMOS technology. In one embodiment, the oscillator subsystem 140 is implemented in a deep-submicron CMOS node. In some embodiments, the oscillator subsystem 140 may be a $4^{th}$-order oscillator system as illustrated in FIG. 2.

The oscillator subsystem 140 includes an amplifier 141 and a feedback loop 142. Since amplifiers contribute a significant amount of noise to oscillators, the present invention advantageously includes only amplifier 141 in the oscillator subsystem 140. The amplifier 141 is configured to provide an intermediate signal and may be a conventional amplifier commonly employed in LC tank based oscillators. The feedback loop 142 includes an $n^{th}$-order complex LC tank 143 and is configured to generate the resonating signal by feeding back a complex-filtered form of the intermediate signal to the amplifier 141. The output of the oscillator subsystem 140 could be the intermediate signal or almost any signal in the feedback loop 142, preferably after buffering with a high input impedance amplifier.

Previously, a concern of using a complex LC tank in an oscillator was the potential of having multiple resonance (i.e., multiple oscillation frequencies). The complex LC tank 143, however, can advantageously be used to provide high-order filtering without generating multiple oscillation frequencies. Accordingly, the oscillator subsystem 140 is advantageously configured to generate the resonating signal at a single oscillating frequency.

The complex LC tank 143 includes a first LC tank 144 and a second LC tank 145 that are configured to generate the resonating signal. The first and second LC tanks 144, 145, act as a voltage divider to provide the complex-filtered signal back to the amplifier 141. The first and second LC tanks 144, 145, may include conventional components. Typically, the first and second LC tanks 144, 145, are actively coupled together. Actively coupled is defined as electrically connected, such as, for example, hardwiring the first and second LC tanks 144, 145, together. In other embodiments, the complex LC tank 143 may include more than two LC tanks.

Turning now to FIG. 2, illustrated is a block diagram of an embodiment of a $4^{th}$-order oscillator system, generally designated 200, constructed according to the principles of the present invention. The oscillator system 200 includes an amplifier 210 and a feedback loop 220. The feedback loop 220 includes a complex LC tank 230 that has a first LC tank 240 and a second LC tank 250. The oscillator system 200 is advantageously embodied using CMOS technology. Of course, one skilled in the art will understand that the oscillator system 200 can be embodied using other technologies.

Each of the components of the first and second LC tanks 240, 250, are passive components, such as inductors, resistors and capacitors, that are well known in the art. The first LC tank 240 includes a resistance r1, an inductance L1 and a capacitance C1. The second LC tank 250 includes a resistance R2, an inductance L2 and a capacitance C2. In the oscillator system 200, r1 and R2 represent a parasitic resistance. In the present invention, the lower-case "r" represents series parasitic resistance and the upper-case "R" denotes a parallel equivalent parasitic resistance.

The $4^{th}$-order oscillator system 200 provides a resonating signal for devices, such as, the communications system 100 of FIG. 1. The amplifier 210 may be a conventional amplifier configured to provide an intermediate signal. The feedback loop 220 is configured to generate the resonating signal by feeding back a complex-filtered form of the intermediate signal to the amplifier 210. The amplifier 210 employs the complex-filtered feedback signal and an input signal to provide the intermediate signal.

The impedance of the complex LC tank 230 can be represented by Equation 1 below:

$$Z(\omega) = \frac{s^2 L_2 C_1}{s^4 L_1 L_2 C_1 C_2 + s^2 (L_1 C_1 + L_2 C_2 + L_2 C_1) + 1} \quad \text{(Equation 1)}$$

assuming, to simplify discussion, parasitic resistance r1=r2=0, i.e., R2=2(1+$Q_{L2}^2$)=infinity, where $Q_{L2}$ is Q of the second LC tank 250. Thus, instead of an a $2^{nd}$-order impedance as in many LC tanks of conventional LC-tank oscillators, the complex LC tank 230 has an impedance with a $2^{nd}$-order equation in the numerator and a $4^{th}$-order equation in the denominator so that the magnitude of the impedance rolls off from its peak at a greater rate along both positive and negative offset frequencies.

The complex LC tank 230 provides a $4^{th}$-order impedance for the $4^{th}$-order oscillator system 200 that provides complex filtering to reduce noise and thus provide an improved resonating signal ($v_O$). More specifically, the first and second LC tanks 240, 250, are configured to attenuate noise from the amplifier 210 by impedance division. Thus, the first and second LC tanks 240, 250, reduce the main noise contributor, amplifier noise, to lower total noise at the feedback point $v_O$. Further phase noise improvements can be realized by combining the oscillator system 200 with LC tanks having a high impedance.

The oscillator system 200 provides an improved resonating signal that can be implemented using deep-submicron CMOS technology. A comparison between oscillators using other LC tank topologies and the improved phase noise performance of the oscillator system 200 is illustrated by TABLE 1. TABLE 1 represents a summary of simulations for phase noise at 20 MHz offset from 3.25 GHz carrier. The simulations were conducted using identical circuit parameters and different LC tanks.

TABLE 1

Simulations for Phase Noise at 20 MHz Offset from 3.25 GHz Carrier

| TYPES OF LC TANK | PHASE NOISE (dBc/Hz) |
| --- | --- |
| Conventional | −150.16 |
| Transformer Based Complex LC Tank | −151.47 |
| LC Tank Without Complex Feedback | −146.95 |
| Complex LC Tank of FIG. 2 | −160.35 |
| Complex LC Tank of FIG. 2 having a high impedance | −164.85 |

Figure 3A:
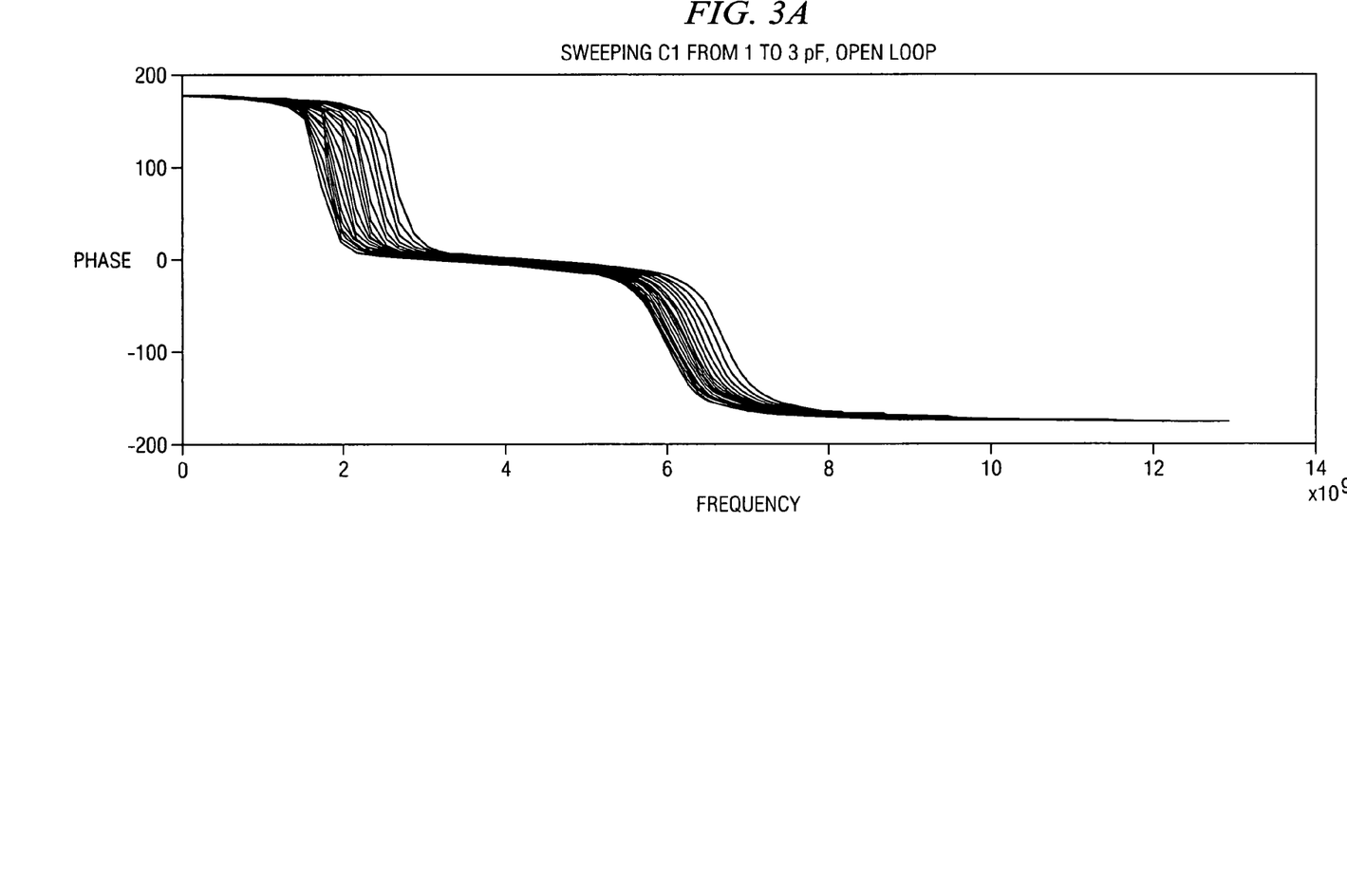
FIGS. 3A-3D illustrate graphs representing phase plots of a resonating signal generated by the oscillator system of FIG. 2 indicating a single resonating frequency.
Figure 3B:
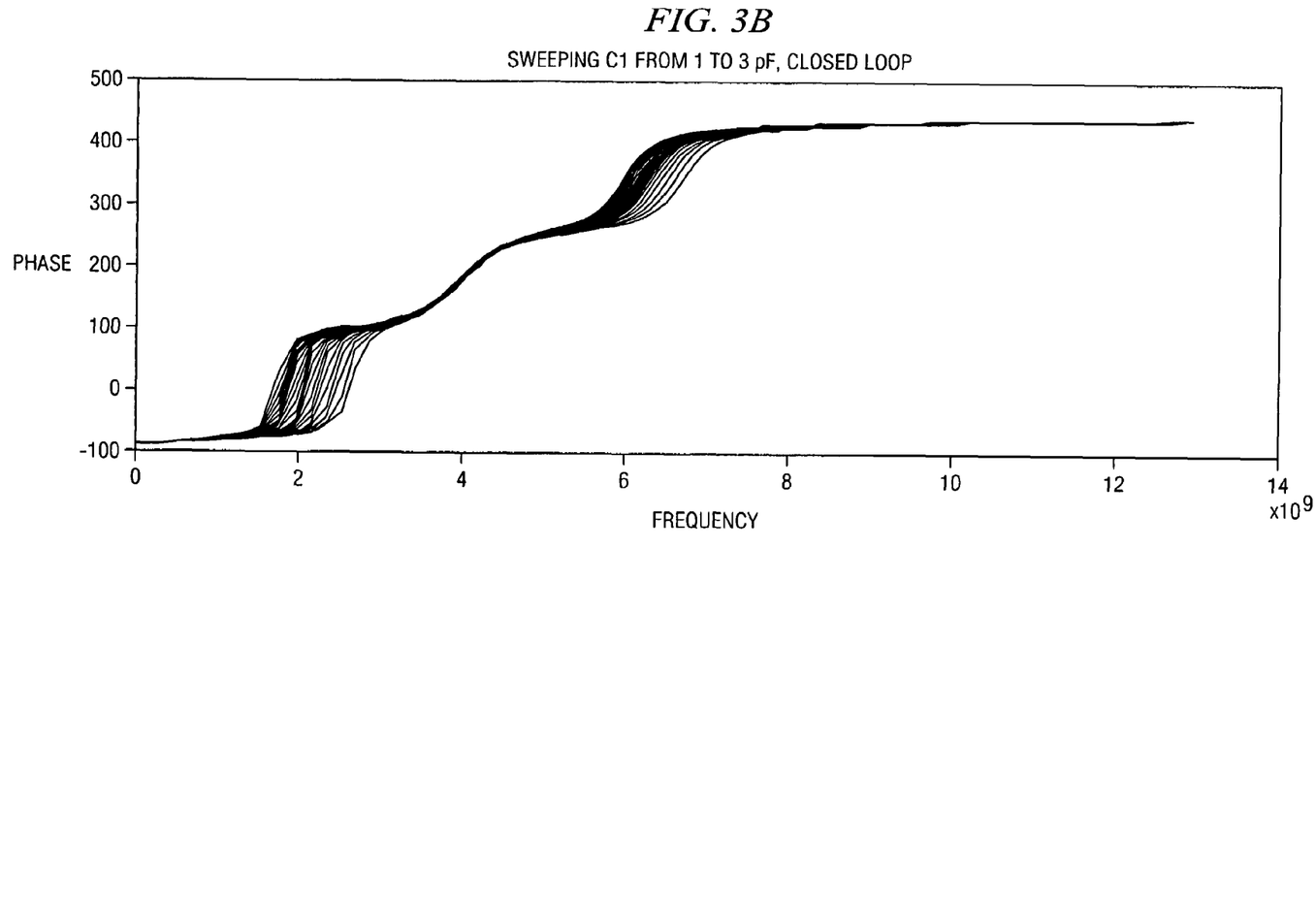

In addition to the improved phase noise performance, the resonating signal provided by the oscillator system 200 is at a single oscillating frequency. This is illustrated by the graphs of FIGS. 3A and 3B using the following parameters: L1=L2=1 nH, C2=1.9 pF, $Q_L$=12, $Q_C$=80. $Z_1$ and $Z_2$ are the respective impedances of the first LC tank 240 and the second LC tank 250. C1 is varied from 1 to 3 pF resulting in phase plots for $Z_{open}=Z_2/(Z_1+Z_2)$ and $Z_{close}$=Gm($Z_1+Z_2$)/(1−Gm($Z_1+Z_2$)$Z_{open}$)=GM($Z_1+Z_2$)/(1−Gm$Z_2$) are shown in FIGS. 3A and 3B, respectively.

Figure 3C:
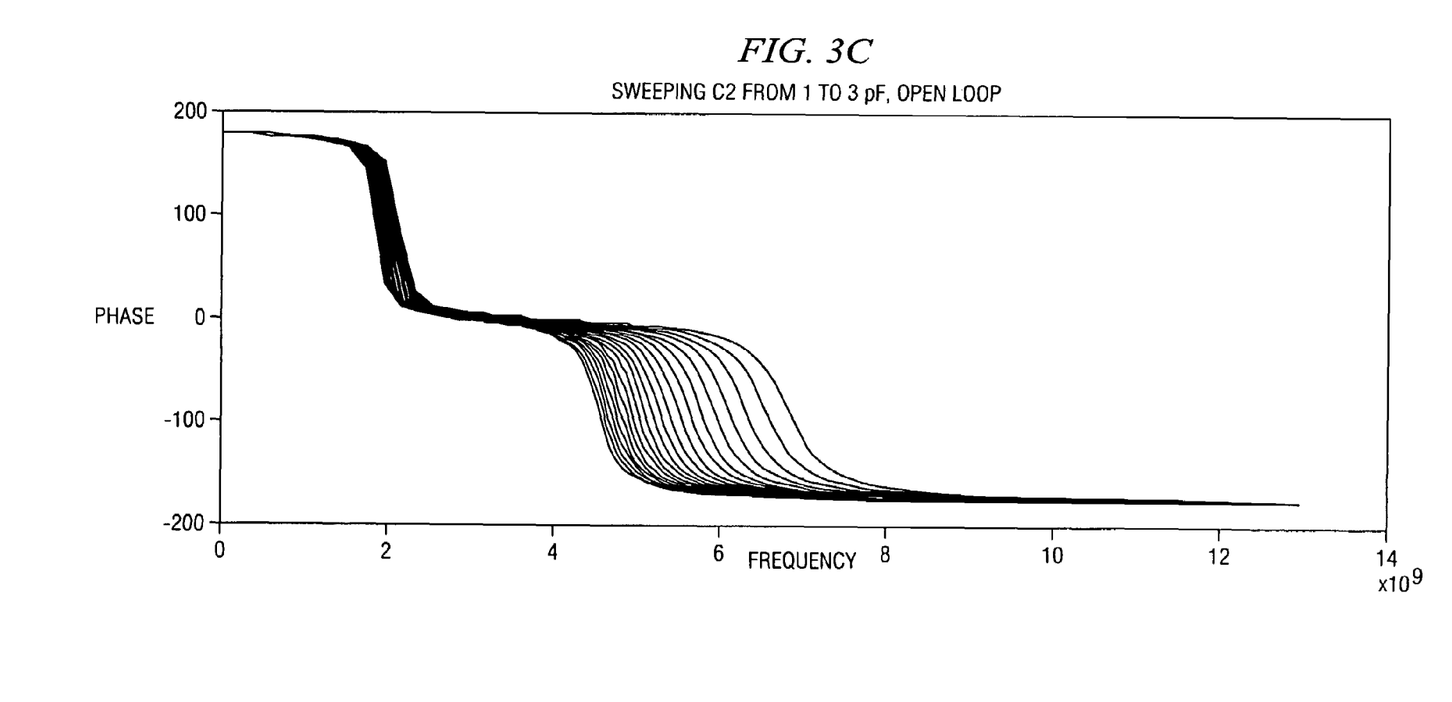
Figure 3D:
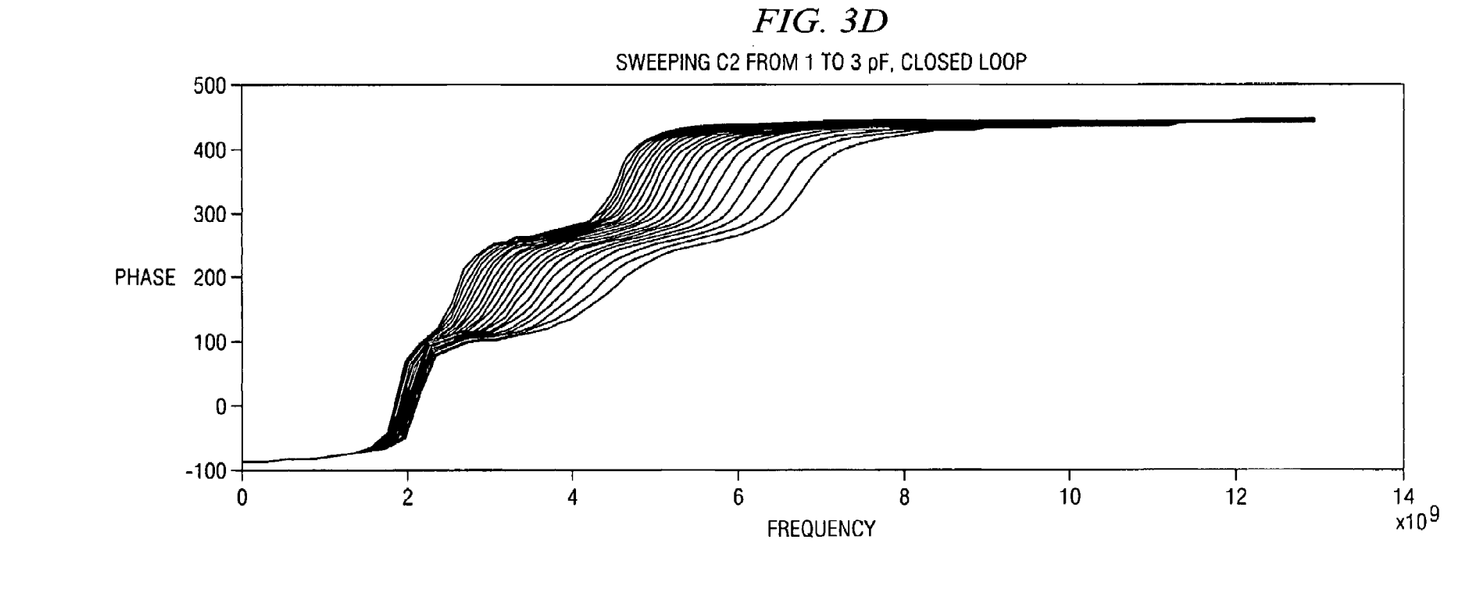

FIG. 3A illustrates that only one point exists with phase=0° for $Z_{open}$, i.e., no second resonance. FIG. 3B shows that the phase of $Z_{close}$ crosses 0° and 360° only once indicating that oscillation will be sustained as long as the amplifier provides enough energy to cancel the energy loss due to r1 and R2. Similarly, as illustrated in FIGS. 3C and 3D, no second resonance exists when sweeping C2 between 1 and 3 pF and keeping C1=1.9 pF.

Figure 4:
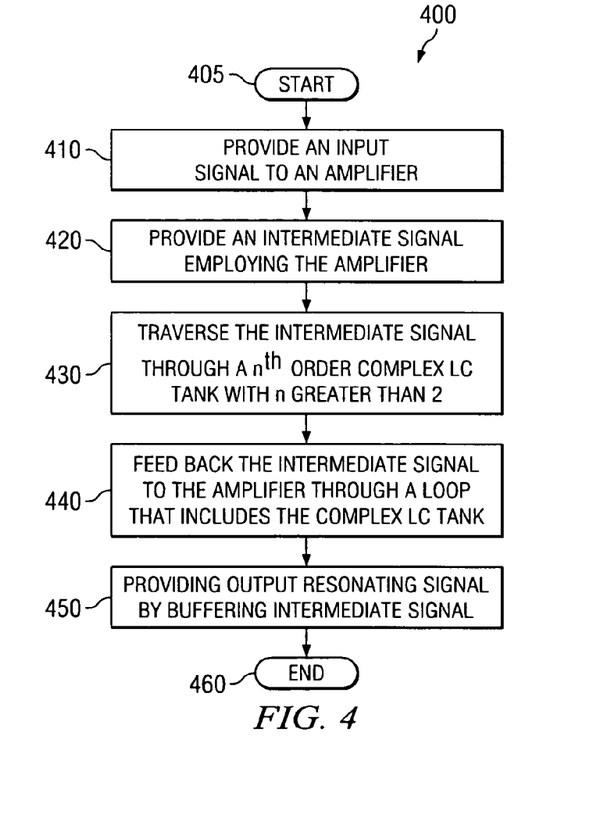
FIG. 4 illustrates a flow diagram of an embodiment of a method of generating a resonating signal carried out according to the principles of the present invention.

Turning now to FIG. 4, illustrated is a flow diagram of an embodiment of a method of generating a resonating signal, generally designated 400, carried out according to the principles of the present invention. The method 400 is triggered by an intent to generate a resonating signal in a step 405.

After starting, an input signal is provided to an amplifier in a step 410. The input signal may be an input voltage. The amplifier may be a conventional amplifier typically employed in oscillators associated with RF transceivers. In one embodiment, only one amplifier is employed.

After providing the input signal, an intermediate signal is provided employing the amplifier in a step 420. The intermediate signal is an output of the amplifier. After it is provided, the intermediate signal traverses through an $n^{th}$-order complex LC tank in a step 430 with n greater than 2. In one embodiment, n is four. The complex LC tank may comprise two LC tanks. In some embodiments, the two LC tanks may be actively coupled together. The complex LC tank may include more than two LC tanks. Advantageously, LC tanks of the complex LC tank may have a high impedance. Additionally, the amplifier and the complex LC tank may be embodied in a deep-submicron CMOS node.

A complex-filtered form of the intermediate signal is fed back to the amplifier through a loop that includes the complex LC tank to generate the resonating signal in a step 440. The complex LC tank provides complex filtering for the resonating signal. In some embodiments, the complex LC tank provides $4^{th}$-order complex filtering.

After feeding back the complex-filtered signal, the resonating signal is provided by buffering the intermediate signal in a step 450. Advantageously a signal having the largest amplitude is used for the output resonating signal. In certain embodiments, for example, the illustrated embodiment of FIG. 1, the intermediate signal is the largest-amplitude signal. One skilled in the art, however, will understand that another signal besides the intermediate signal may be used. If an effective total node capacitance is large enough and an input impedance of a subsequent stage is sufficiently large, buffering of the intermediate signal may not be needed.

After providing the output resonating signal, the method 400 ends in a step 460. Thus, the resonating signal can be generated in a continual loop. Of course, one skilled in the art will understand that the continuous generation of the resonating signal can end by terminating any of the steps 410-440. For example, generation of the resonating signal can be terminated by removing the input signal or power supply to the amplifier allowing the oscillation to die away.

Although the present invention has been described in detail, those skilled in the art should understand that they can

What is claimed is:

1. An $n^{th}$-order oscillator system for providing a resonating signal, n being at least four, comprising:
   an amplifier configured to provide an intermediate signal;
   a feedback loop including an $n^{th}$-order complex LC tank and configured to generate said resonating signal by feeding back a complex-filtered form of said intermediate signal at its resonating frequency to said amplifier; and
   wherein said complex LC tank comprises at least two LC tanks.

2. The oscillator system as recited in claim 1 wherein said LC tanks are actively coupled together.

3. The oscillator system as recited in claim 1 wherein said resonating signal is at a single oscillating frequency.

4. The oscillator system as recited in claim 1 wherein said oscillator system is embodied in a deep-submicron CMOS process technology.

5. An $n^{th}$-order oscillator system for providing a resonating signal, n being at least four, comprising:
   only one amplifier configured to provide an intermediate signal;
   a feedback loop including an $n^{th}$-order complex LC tank and configured to generate said resonating signal by feeding back a complex-filtered form of said intermediate signal to said amplifier; and
   wherein said complex LC tank comprises at least two LC tanks.

6. An $n^{th}$-order oscillator system for providing a resonating signal, n being at least four, comprising:
   an amplifier configured to provide an intermediate signal; and
   a feedback loop including an $n^{th}$-order complex LC tank and configured to generate said resonating signal by feeding back a complex-filtered form of said intermediate signal to said amplifier, wherein said complex LC tank comprises at least two LC tanks configured as a voltage divider.

7. A method of providing a resonating signal, comprising:
   providing an intermediate signal employing an amplifier; and
   generating said resonating signal by feeding back a complex-filtered form of said intermediate signal to said amplifier through a loop that includes an $n^{th}$-order complex LC tank, n being at least four and wherein said complex LC tank comprises at least two LC tanks.

8. The method as recited in claim 7 wherein said LC tanks are actively coupled together.

9. The method as recited in claim 7 wherein said resonating signal is at a single oscillating frequency.

10. The method as recited in claim 7 wherein said amplifier and said complex LC tank are embodied in a deep-submicron CMOS process technology.

11. A method of providing a resonating signal, comprising:
    providing an intermediate signal employing only one amplifier; and
    generating said resonating signal by feeding back a complex-filtered form of said intermediate signal to said amplifier through a loop that includes an $n^{th}$-order complex LC tank, n being at least four and wherein said complex LC tank comprises at least two LC tanks.

12. A method of providing a resonating signal, comprising:
    providing an intermediate signal employing an amplifier; and
    generating said resonating signal by feeding back a complex-filtered form of said intermediate signal to said amplifier through a loop that includes an $n^{th}$-order complex LC tank, n being at least four and wherein said complex LC tank comprises at least two LC tanks configured as a voltage divider.

13. A communications system, comprising:
    a receiver; and
    an $n^{th}$-order oscillator subsystem for providing a resonating signal to said receiver, n being at least four, including:
      an amplifier configured to provide an intermediate signal; and
      a feedback loop including an $n^{th}$-order complex LC tank wherein said complex LC tank comprises at least two LC tanks and configured to generate said resonating signal by feeding back a complex-filtered form of said intermediate signal at its resonating frequency to said amplifier.

14. The communications system as recited in claim 13 wherein said LC tanks are actively coupled together.

15. The communications system as recited in claim 13 wherein said n is four.

16. The communications system as recited in claim 13 wherein said resonating signal is at a single oscillating frequency.

17. The communications system as recited in claim 13 wherein said oscillator subsystem is embodied in a deep-submicron CMOS process technology.

18. The communications system as recited in claim 13 further comprising a transmitter.

19. A communications system, comprising:
    a receiver; and
    an $n^{th}$-order oscillator subsystem for providing a resonating signal to said receiver, n being at least four, including:
      only one amplifier configured to provide an intermediate signal; and
    a feedback loop including an $n^{th}$-order complex LC tank wherein said complex LC tank comprises at least two LC tanks and configured to generate said resonating signal by feeding back a complex-filtered form of said intermediate signal to said amplifier.

20. A communications system, comprising:
    a receiver; and
    an $n^{th}$-order oscillator subsystem for providing a resonating signal to said receiver, n being at least four, including:
      an amplifier configured to provide an intermediate signal; and
      a feedback loop including an $n^{th}$-order complex LC tank and configured to generate said resonating signal by feeding back a complex-filtered form of said intermediate signal to said amplifier, wherein said complex LC tank comprises at least two LC tanks configured as a voltage divider.

* * * * *